(12) United States Patent
Miura et al.

(10) Patent No.: US 9,196,775 B2
(45) Date of Patent: Nov. 24, 2015

(54) SOLAR BATTERY CELL (75) Inventors: Teruto Miura, Chiyoda-ku (JP);
Daisuke Echizenya, Chiyoda-ku (JP);
Masashi Nakamura, Chiyoda-ku (JP);
Shinsuke Miyamoto, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 21 days.

(21) Appl. No.: 13/504,816

(22) PCT Filed: Nov. 13, 2009

(86) PCT No.: PCT/JP2009/069387
§ 371 (c)(1),
(2), (4) Date: Apr. 27, 2012

(87) PCT Pub. No.: WO2011/058653
PCT Pub. Date: May 19, 2011

(65) Prior Publication Data
US 2012/0216861 A1 Aug. 30, 2012

(51) Int. Cl.
*H01L 31/0224* (2006.01)
*H01L 31/05* (2014.01)

(52) U.S. Cl.
CPC .... *H01L 31/0504* (2013.01); *H01L 31/022425* (2013.01); *Y02E 10/50* (2013.01)

(58) Field of Classification Search
CPC .............. H01L 31/022425; H01L 31/022433; H01L 31/022441; H01L 31/022458; H01L 31/0224; H02L 35/00; H02L 35/02; H02L 35/04; H02L 35/10
USPC ............................................ 136/256; 438/98
See application file for complete search history.

(56) References Cited

U.S. PATENT DOCUMENTS

| 4,108,714 | A * | 8/1978 | Keller et al. .................. 264/213 |
| 4,450,843 | A * | 5/1984 | Barney et al. ................. 600/503 |
| 2007/0144577 | A1 * | 6/2007 | Rubin et al. .................. 136/256 |
| 2008/0105297 | A1 | 5/2008 | Nishida et al. |
| 2010/0193028 | A1 | 8/2010 | Nishida et al. |

(Continued)

FOREIGN PATENT DOCUMENTS

| CN | 101106163 A | 1/2008 |
| CN | 101213672 A | 7/2008 |

(Continued)

OTHER PUBLICATIONS

Definition of "gradually" from thefreedictionary.com accessed Aug. 25, 2014.*

(Continued)

*Primary Examiner* — Jeffrey T Barton
*Assistant Examiner* — Meisha Binkley
(74) *Attorney, Agent, or Firm* — Buchanan Ingersoll & Rooney PC (57) ABSTRACT

In a solar battery cell, a plurality of silver electrodes are formed in a dot shape with a predetermined gap therebetween linearly along a rear surface tab line. Pitches among the silver electrodes are set so as to be large in a central part of a silicon substrate and small at the ends of the silicon substrate. By arranging many silver electrodes at ends of the silicon substrate having a large stress, the rigidity at the ends is improved, and the warpage is decreased, thereby suppressing cell cracking.

4 Claims, 8 Drawing Sheets

(56) References Cited

U.S. PATENT DOCUMENTS

| | | | |
|---|---|---|---|
| 2010/0200057 A1* | 8/2010 | Miyake et al. ............... | 136/256 |
| 2011/0146745 A1 | 6/2011 | Echizenya et al. | |

FOREIGN PATENT DOCUMENTS

| | | | |
|---|---|---|---|
| EP | 2180522 A1 | | 4/2010 |
| JP | 2002-141496 A | | 5/2002 |
| JP | 2002-141533 A | | 5/2002 |
| JP | 2002217435 A | * | 8/2002 |
| JP | 2003-224289 A | | 8/2003 |
| JP | 2004-087986 A | | 3/2004 |
| JP | 2005-294679 A | | 10/2005 |
| JP | 2009-164509 A | | 7/2009 |
| WO | WO 2007/060743 A1 | | 5/2007 |
| WO | WO 2009/019929 A1 | | 2/2009 |
| WO | WO 2009017174 A1 | * | 2/2009 |

OTHER PUBLICATIONS

English machine translation of JP2002-217425A.*

International Search Report (PCT/ISA/210) issued on Jan. 26, 2010, by Japanese Patent Office as the International Searching Authority for International Application No. PCT/JP2009/069387.

Written Opinion (PCT/ISA/237) issued on Jan. 26, 2010, by Japanese Patent Office as the International Searching Authority for International Application No. PCT/JP2009/069387.

Chinese Notification of the First Office Action dated May 4, 2014 issued in the corresponding Chinese Patent Application No. 200980162404.8 and partial English language translation (8 pages).

European Communication and Supplementary Search Report dated Sep. 15, 2015 issued in the corresponding European Patent Application No. 09851283.3-1504/2500948 (9 pages).

* cited by examiner

SOLAR BATTERY CELL

FIELD

The present invention relates to a solar battery cell that includes a lead bonded to an electrode to extract an electrical output, and can suppress cell cracking after the lead is bonded.

BACKGROUND

A lead made of a rectangular copper wire is bonded to the solar battery cell in order to extract an electrical output. The lead shrinks when it is cooled from a high-temperature state immediately after bonding to an ordinary temperature. The shrinkage of the lead causes warpage or local deformation of a substrate, thereby causing cracking in the solar battery cell.

Lead bonding electrodes that extend linearly are formed on a light receiving surface (a front face) of a semiconductor substrate constituting the solar battery cell in order to bond the lead. On the other hand, lead bonding electrodes are formed in a dot shape (in a form like stepping stones) on a rear surface of the substrate with a predetermined gap therebetween also to bond the lead. A portion other than the lead bonding electrodes formed in a dot shape on the rear surface of the substrate is made as an aluminum electrode across the substrate.

The lead bonding electrode can be continuously provided from one end to the other end of the semiconductor substrate along the lead. However, because the strength of a boundary portion between the aluminum electrode and the lead bonding electrode is low, when cracking occurs at any part of the lead bonding electrode, the cracking spreads over the full length of the semiconductor substrate along the boundary.

To avoid this situation, conventionally, lead bonding electrodes have been formed in a dot shape (in a form like stepping stones) with a predetermined gap therebetween as described above. With this configuration, even when cracking occurs at any part of the boundary portion, the cracking does not spread to adjacent lead bonding electrodes (see, for example, Patent Literature 1).

CITATION LIST

Patent Literature

Patent Literature 1: Specification of International Publication No. WO2009/019929

SUMMARY

Technical Problem

Generally, when a lead made of a rectangular copper wire is soldered, a stress is applied at the time of cooling due to the difference in linear expansion coefficients of the lead and the semiconductor substrate. Specifically, the lead (copper) has a larger shrinkage factor than that of the semiconductor substrate, and thus the lead applies a stress so as to reduce the gap between the lead bonding electrodes formed on the surface of the solar battery cell. A light-receiving surface lead is connected to the light receiving surface, and a rear surface lead is connected to the rear surface. Both of the leads apply a stress so as to shrink the substrate surface. However, because the stress applied from the rear surface lead largely affects the semiconductor substrate, the semiconductor substrate warps so that the rear surface side becomes concave.

When thin plates having a different shrinkage factor are stuck together to form a flat plate, if one of the thin plates shrinks, the flat plate is warped toward the side of the other plate. The warpage thereof is gradually added from a central part to the end of the flat plate (for example, like a small piece of a heated squid), and the flat plate is curved most at the ends thereof. This is obvious from simulations and experiments performed by the present inventors that the warpage becomes largest at the ends of the semiconductor substrate. The warpage at the ends of the semiconductor substrate causes cell cracking, and thus improvements therefor have been desired.

The present invention has been achieved to solve the problems mentioned above, and an object of the present invention is to provide a solar battery cell that can decrease excessive deformation generated at ends of a semiconductor substrate to suppress occurrence of cracking.

Solution To Problem

A solar battery cell according to an aspect of the present invention includes: a light-receiving-surface lead bonding electrode on a light receiving surface of a semiconductor substrate that receives sunlight to generate power; and rear-surface lead bonding electrodes on a rear surface of the semiconductor substrate, wherein in the solar battery cell, a light-receiving surface lead and a rear surface lead are connected to the light-receiving-surface lead bonding electrode and the rear-surface lead bonding electrode, respectively, and generated power is extracted, and wherein the rear-surface lead extends linearly on a rear surface of the semiconductor substrate, and a plurality of the rear-surface lead bonding electrodes are formed in a dot shape with a predetermined gap therebetween linearly along the rear surface lead, and pitches among the rear-surface lead bonding electrodes are set so as to be large in a central part of the semiconductor substrate and small at ends of the semiconductor substrate.

Advantageous Effects of Invention

According to the solar battery cell of the present invention, the arrangement of the rear-surface lead bonding electrodes becomes dense at the ends of the semiconductor substrate to increase the rigidity of the substrate, thereby decreasing the warpage at the ends of the semiconductor substrate. Accordingly, occurrence of cracking of the semiconductor substrate is suppressed.

DESCRIPTION OF EMBODIMENTS

Exemplary embodiments of a solar battery cell according to the present invention will be explained below in detail with reference to the accompanying drawings. In the following embodiments, there is explained an example in which a semiconductor substrate is a silicon substrate, a light-receiving-surface lead bonding electrode is a bus bar electrode, a lead is a tab line, and a rear-surface lead bonding electrode is a silver electrode. The present invention is not limited to the embodiments.

First Embodiment

Figure 1:
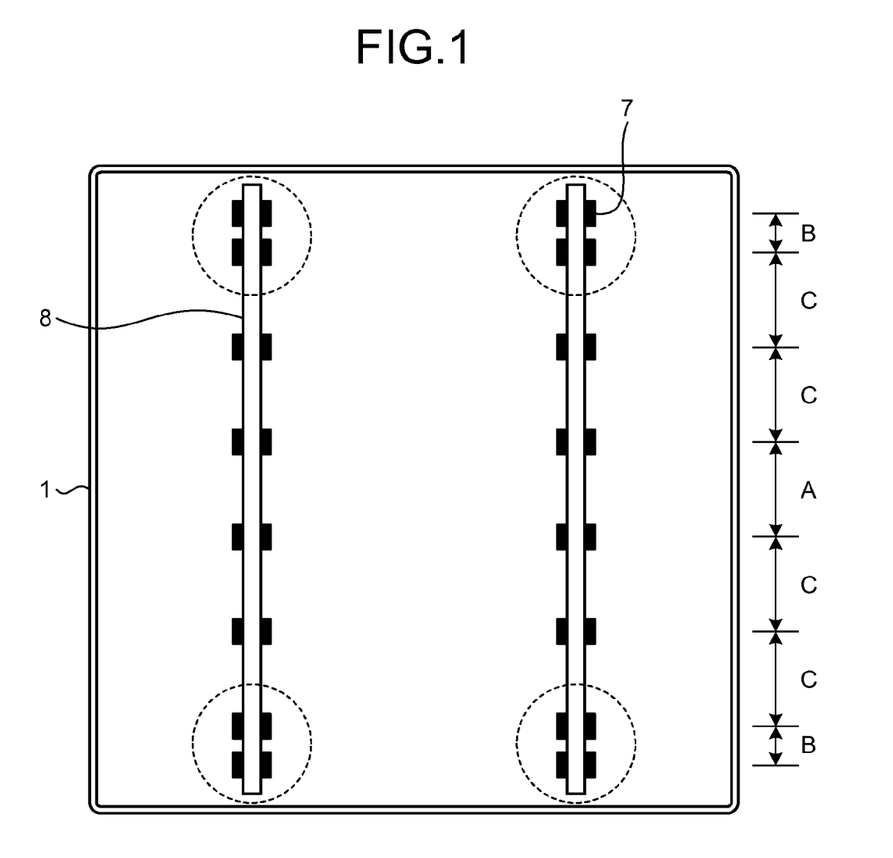
FIG. 1 depicts a solar battery cell according to a first embodiment of the present invention as viewed from a rear surface side.
Figure 2:
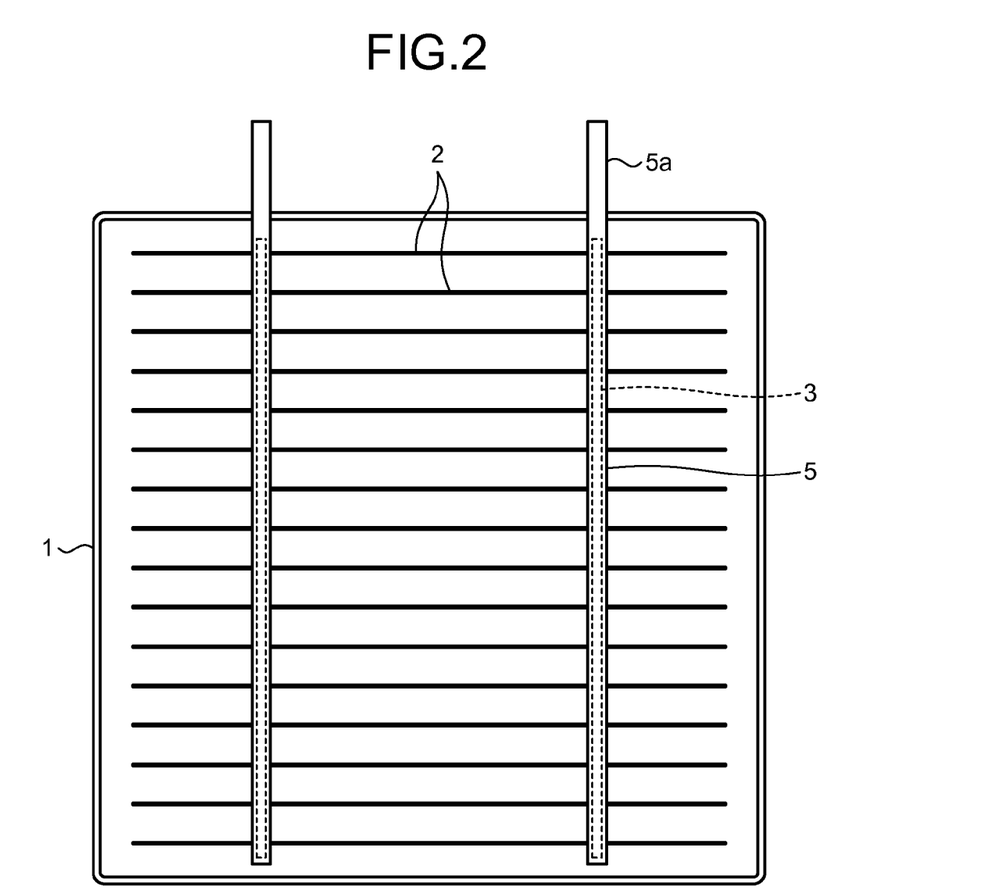
FIG. 2 depicts the solar battery cell according to the first embodiment of the present invention as viewed from a light receiving surface side.
Figure 3:
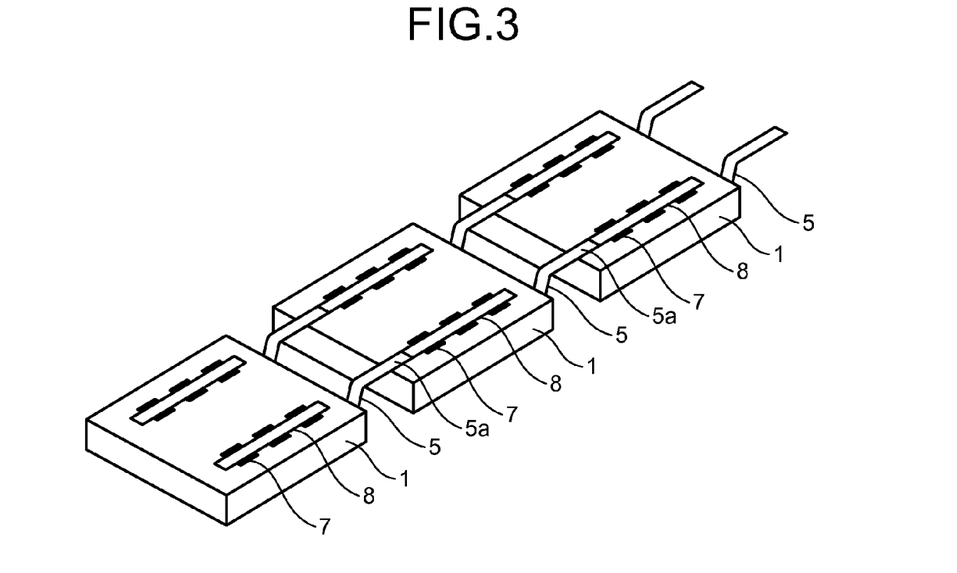
FIG. 3 is a perspective view of a state where a plurality of solar battery cells are sequentially connected by a light-receiving surface lead and a rear surface lead.
Figure 4:
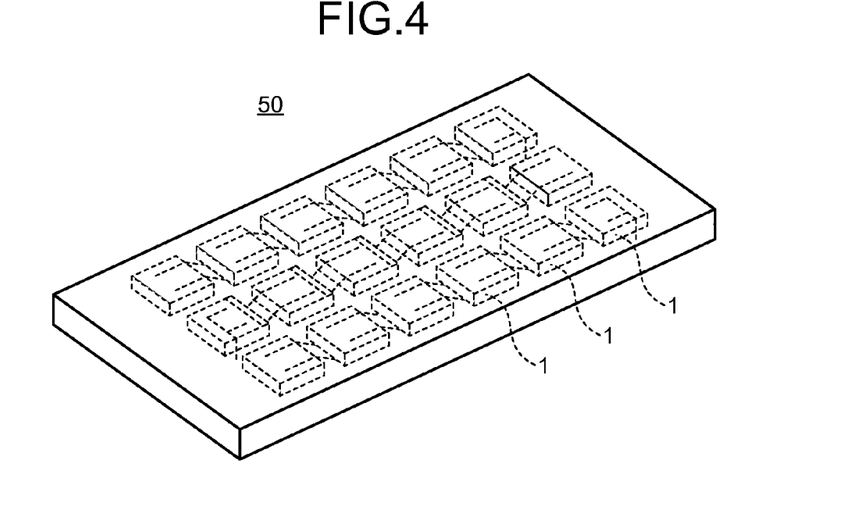
FIG. 4 is a perspective view of a state where solar battery arrays constituted by solar battery cells sequentially connected by the light-receiving surface lead and the rear surface lead are sealed in a solar battery module.
Figure 5:
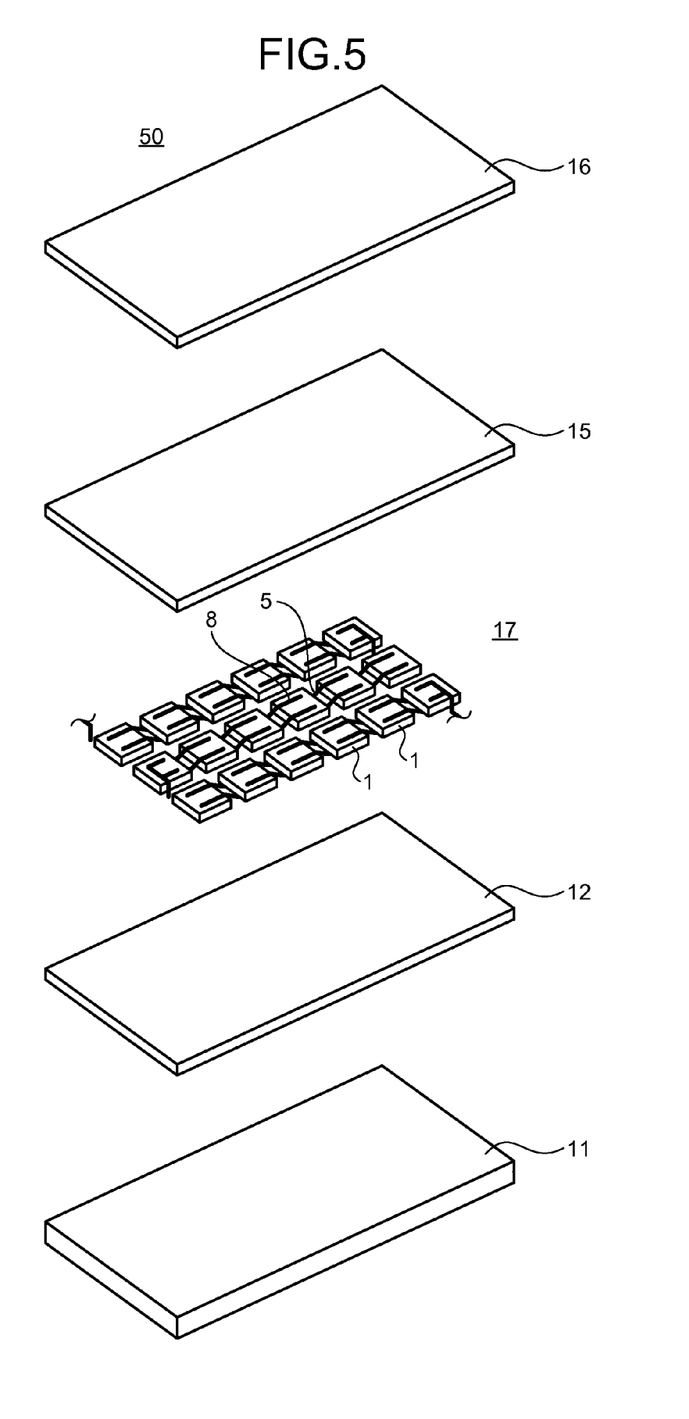
FIG. 5 is an exploded perspective view of the solar battery module in FIG. 4.

FIG. 1 depicts a solar battery cell according to a first embodiment of the present invention as viewed from a rear surface side. FIG. 2 depicts the solar battery cell according to the first embodiment of the present invention as viewed from a light receiving surface side. FIG. 3 is a perspective view of a state where a plurality of solar battery cells are sequentially connected by a light-receiving surface lead and a rear surface lead. FIG. 4 is a perspective view of a state where solar battery arrays constituted by the solar battery cells sequentially connected by the light-receiving surface lead and the rear surface lead are sealed in a solar battery module. FIG. 5 is an exploded perspective view of the solar battery module in FIG. 4. In the perspective views of FIGS. 3 to 5, the rear surface of the silicon substrate is directed upward so that the relation between the rear-surface lead bonding electrode and the rear surface lead is clearly shown.

The solar battery cell according to the present embodiment includes a silicon substrate (semiconductor substrate) 1 having a rectangular plate shape with one side being 140 to 160 millimeters. A plurality of silver electrodes (rear-surface lead bonding electrodes) 7 formed in a dot shape are provided in two rows on the rear surface of the silicon substrate 1 with a predetermined gap therebetween. As shown in FIG. 1, the silver electrodes 7 in two rows are provided in a form like stepping stones with a predetermine gap therebetween on straight lines opposite to bus bar electrodes 3, which are described later. A rear-surface tab line (rear surface lead) 8 is bonded to an upper surface of the silver electrodes 7 substantially over the entire length of the row. The width of the rear-surface tab line 8 is smaller than that of the silver electrode 7. A characteristic of the present embodiment is pitches of the silver electrodes 7 provided in a form like stepping stones, and details thereof are described later. The rear-surface tab line 8 is a solder-plated rectangular copper wire generally used as a lead for a solar battery.

As shown in FIG. 2, a plurality of thin grid electrodes 2 that collect power from the entire surface of a cell while ensuring a light receiving area as much as possible are arranged on the light receiving surface of the silicon substrate 1, substantially over the full width of the silicon substrate 1 and parallel to each other. Two bus bar electrodes (light-receiving-surface lead bonding electrodes) 3 are provided linearly and substantially over the full length of the silicon substrate 1, while substantially orthogonally intersecting with the grid electrodes 2. Furthermore, a light-receiving-surface tab line (light-receiving surface lead) 5 is bonded on an upper surface of the bus bar electrode 3 substantially over the full length thereof. The width of the light-receiving-surface tab line 5 is the same as or slightly smaller than that of the bus bar electrode 3. The light-receiving-surface tab line 5 includes an extended portion 5*a* protruding outward from the surface of the cell for serially connecting the silicon substrates 1 to each other. The light-receiving-surface tab line 5 is a solder-plated rectangular copper wire generally used as a lead for a solar battery. In the present embodiment, the light-receiving-surface tab line 5 and the rear-surface tab line 8 are described as separate members that are connected to each other on the rear surface of the silicon substrate 1. Alternatively, the light-receiving-surface tab line 5 and the rear-surface tab line 8 can be one continuous tab line (lead).

As shown in FIG. 3, the silicon substrates 1 arranged in parallel are serially connected by electrically connecting the extended portion 5*a* of the light-receiving-surface tab line 5 extending from the light receiving surface side toward the rear surface side of an adjacent silicon substrate 1 with the rear-surface tab line 8 of the adjacent silicon substrate 1 on the rear surface side of the adjacent silicon substrate 1 sequentially. With this arrangement, a predetermined number of the silicon substrates 1 are connected to produce a solar battery array 17 (FIG. 5).

As shown in FIGS. 4 and 5, a layered body constituting relevant parts of a solar battery module 50 is formed by having a translucent substrate 11 made of a transparent material such as glass, a light-receiving-surface sealing material (first resin layer) 12 made of a transparent resin, the solar battery array 17 in which a plurality of the silicon substrates 1 arranged in a grid and the leads 5 and 8 that serially connect these silicon substrates 1 are arranged, a rear-surface sealing material (second resin layer) 15 made of a transparent resin, and a back sheet 16 having excellent weather resistance stacked in this order from the light receiving surface side. The light-receiving-surface sealing material 12 and the rear-surface sealing material 15 are integrated by heat treatment to seal the solar battery array 17 by a resin, thereby forming a resin-sealed layer. An outer peripheral edge of the layered body having such a configuration is covered with a frame (not shown) over the whole circumference, thereby producing the solar battery module 50.

Referring back to FIG. 1, as described above, eight silver electrodes 7 are linearly formed in a dot shape with a predetermined gap therebetween along the rear-surface tab line 8 on the rear surface of the silicon substrate 1. The silver electrode 7 provided at an end is formed such that a central position thereof is away from the end of the silicon substrate 1 by equal to or more than 4 millimeters. As a characteristic of the present embodiment, pitches among the silver electrodes 7 are set so as to be large in the central part of the silicon substrate 1 and small at the ends of the silicon substrate 1. That is, the arrangement of the silver electrodes 7 becomes dense in portions of the silicon substrate 1, which are circled by broken lines in FIG. 1. A portion of the silicon substrate 1 on which the silver electrode 7 is present has a rigidity higher than that of a portion on which the silver electrode 7 is not present. Therefore, the warpage of the silicon substrate 1 is suppressed when the same stress is applied thereon.

Furthermore, the relation of the pitches among the silver electrodes 7 is represented as A=C>B, and as A:B=2:1, when the pitch in the central part of the silicon substrate 1 is designated as A, the pitch at the ends of the silicon substrate 1 is designated as B, and the pitch in an intermediate part between the central part and the ends of the silicon substrate 1 is designated as C.

Figure 6:
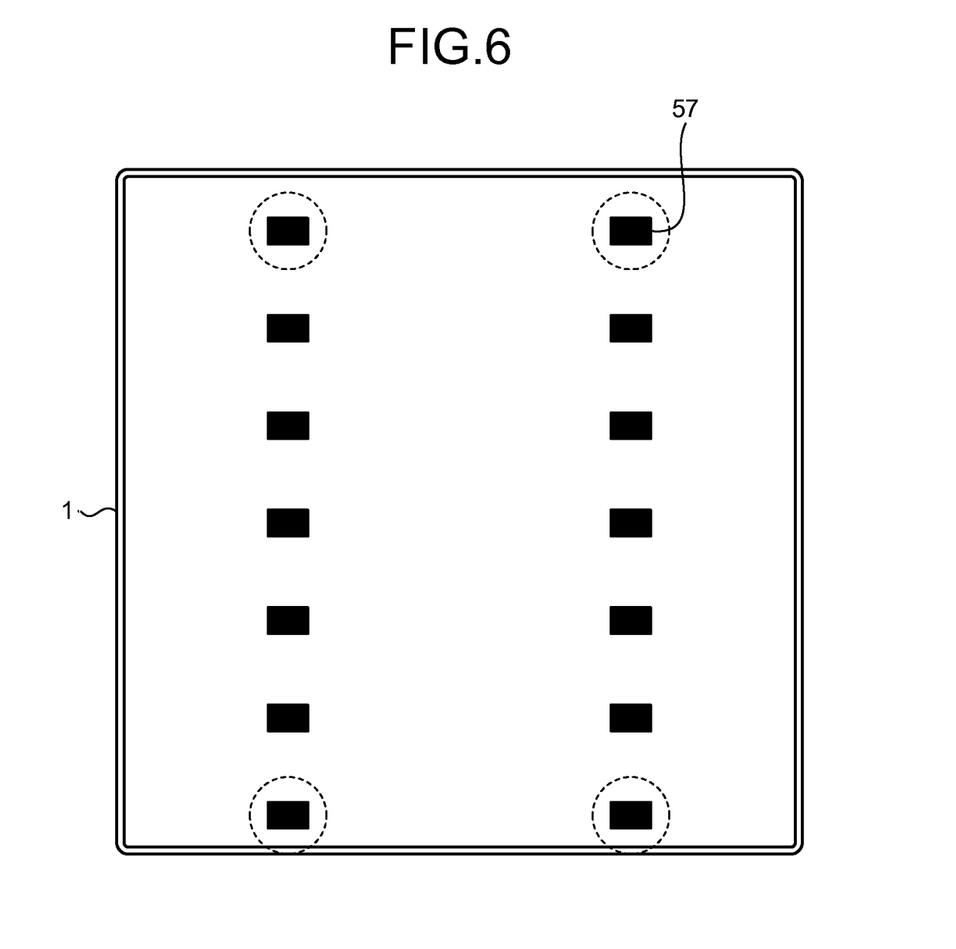
FIG. 6 depicts a conventional solar battery cell as viewed from a rear surface side shown for a comparison.

FIG. 6 depicts a conventional solar battery cell as viewed from a rear surface side shown for a comparison. As shown in FIG. 6, the pitches among silver electrodes 57 in the conventional solar battery cell are set to equal intervals. Therefore, the silicon substrate 1 warps due to the difference in linear expansion coefficients of the silicon substrate 1 and the rear-surface tab line 8, and the warpage of the silicon substrate 1 causes cell cracking in the silicon substrate 1.

The solar battery cell according to the present embodiment includes the bus bar electrodes 3 on the light receiving surface of the silicon substrate 1 that receives sunlight to generate power, and the silver electrodes 7 on the rear surface thereof, from which power generated by connecting the light-receiving-surface tab line 5 and the rear-surface tab line 8 respectively to the bus bar electrodes 3 and the silver electrodes 7 is extracted. The rear-surface tab line 8 extends linearly on the rear surface of the silicon substrate 1. A plurality of the silver electrodes 7 are formed in a dot shape with a predetermined gap therebetween linearly along the rear-surface tab line 8, and pitches among the silver electrodes 7 are set so as to be large in a central part of the silicon substrate 1 and small at the ends of the silicon substrate 1. Therefore, the arrangement of the silver electrodes 7 becomes dense at the ends of the silicon substrate 1 to increase the rigidity of the substrate, thereby decreasing the warpage at the ends of the silicon substrate 1. With this configuration, cell cracking in the silicon substrate 1 is suppressed.

The relation of the pitches among the silver electrodes 7 is represented as A=C>B, and as A:B=2:1, when the pitch in the central part of the silicon substrate 1 is designated as A, the pitch at the ends of the silicon substrate 1 is designated as B, and the pitch in the intermediate part between the central part and the ends of the silicon substrate 1 is designated as C. Therefore, considerations of the arrangement of the silver electrodes 7 are facilitated and the production thereof is also facilitated.

The relation of the pitches among the silver electrodes 7 according to the present embodiment is represented as A=C>B, when the pitch in the central part of the silicon substrate 1 is designated as A, the pitch at the opposite ends of the silicon substrate 1 is designated as B, and the pitch in the intermediate part between the central part and the ends of the silicon substrate 1 is designated as C. However, the same effect can be achieved even when the relation of the pitches is represented as A≥C>B.

EXAMPLE

The present inventors have confirmed the effect of the present embodiment by simulations and experiments. The magnitude of warpage generated at the ends of a silicon substrate was observed by using a silicon substrate on which silver electrodes were arranged as in a conventional manner as shown in FIG. 6, and a silicon substrate on which silver electrodes were arranged as in the present embodiment, both having a thickness from 160 to 200 micrometers.

When the magnitude of the warpage in the conventional technique is assumed to be 100%, in a silicon substrate having a thickness of 180 micrometers and that having a thickness of 200 micrometers, the magnitude of the warpage were 96% and 95%, respectively, and thus the effect of suppressing the warpage was not so large. In contrast, in a silicon substrate having a thickness of 160 micrometers, the magnitude of the warpage was 86%, which was a considerable decrease.

Deformation amount (deformation amount in conventional technique is assumed to be 100%)

Thickness of 160 micrometers: 86%
Thickness of 180 micrometers: 96%
Thickness of 200 micrometers: 95%

From the above results, it has become obvious that the present embodiment has an effect of suppressing the warpage in the silicon substrate having a thickness equal to or less than 200 micrometers, and particularly it has become obvious that the present embodiment is more effective in the silicon substrate having a thickness equal to or less than 160 micrometers.

In the present embodiment, eight silver electrodes 7 are linearly formed in a dot shape with a predetermined gap therebetween. However, the number of silver electrodes is not limited to eight, and the configuration of the present embodiment can be applied to a silicon substrate on which equal to or more than four silver electrodes 7 are formed in a dot shape.

Furthermore, in the present embodiment, two light-receiving-surface tab lines 5 and two rear-surface tab lines 8 are provided. However, the configuration of the present embodiment can be also applied to a case where equal to or three or more light-receiving-surface tab lines 5 and rear-surface tab lines 8 are provided.

Second Embodiment

Figure 7:
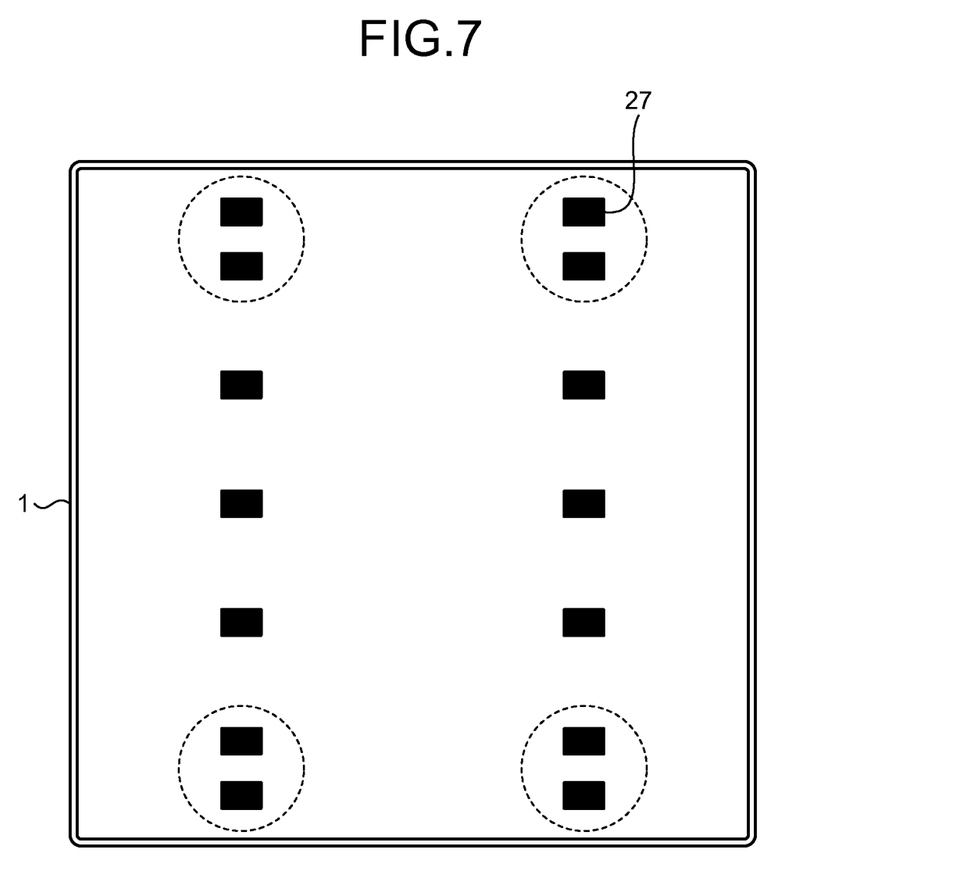
FIG. 7 depicts a solar battery cell according to a second embodiment of the present invention as viewed from a rear surface side.

FIG. 7 depicts a solar battery cell according to a second embodiment of the present invention as viewed from a rear surface side. In the present embodiment, seven silver electrodes 27 are provided in one row. A plurality of silver electrodes 27 are linearly formed in a dot shape with a predetermined gap therebetween along the rear-surface tab line 8, similarly to that of the first embodiment. The pitches among the silver electrodes 27 are set so as to be large in the central part of the silicon substrate 1 and small at the ends of the silicon substrate 1. Therefore, the arrangement of the silver electrodes 27 becomes dense at the ends of the silicon substrate 1 to increase the rigidity of the substrate, thereby decreasing the warpage at the ends of the silicon substrate 1. With this configuration, cell cracking in the silicon substrate 1 is suppressed. As is obvious from the comparison with the silver electrodes 57 of the conventional solar battery cell shown in FIG. 6, the number of silver electrodes is not increased. Therefore, the cost does not increase as compared to conventional solar battery cells.

Third Embodiment

Figure 8:
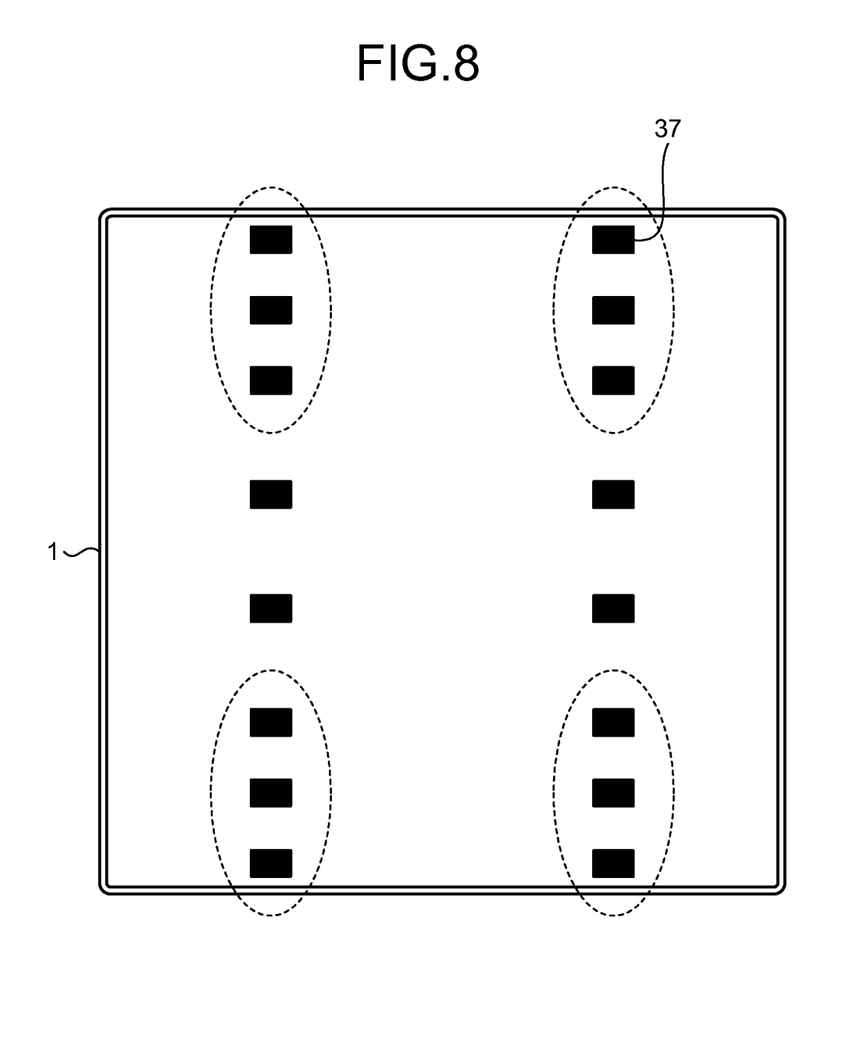
FIG. 8 depicts a solar battery cell according to a third embodiment of the present invention as viewed from a rear surface side.

FIG. 8 depicts a solar battery cell according to a third embodiment of the present invention as viewed from a rear surface side. In the present embodiment, silver electrodes 37 in a small pitch are provided at the ends of the silicon substrate 1 continuously for two pitches. By having such a configuration, the arrangement of the silver electrodes 37 becomes denser at the ends of the silicon substrate 1 so as to increase the rigidity of the substrate further, thereby further decreasing the warpage at the ends of the silicon substrate 1.

Fourth Embodiment

Figure 9:
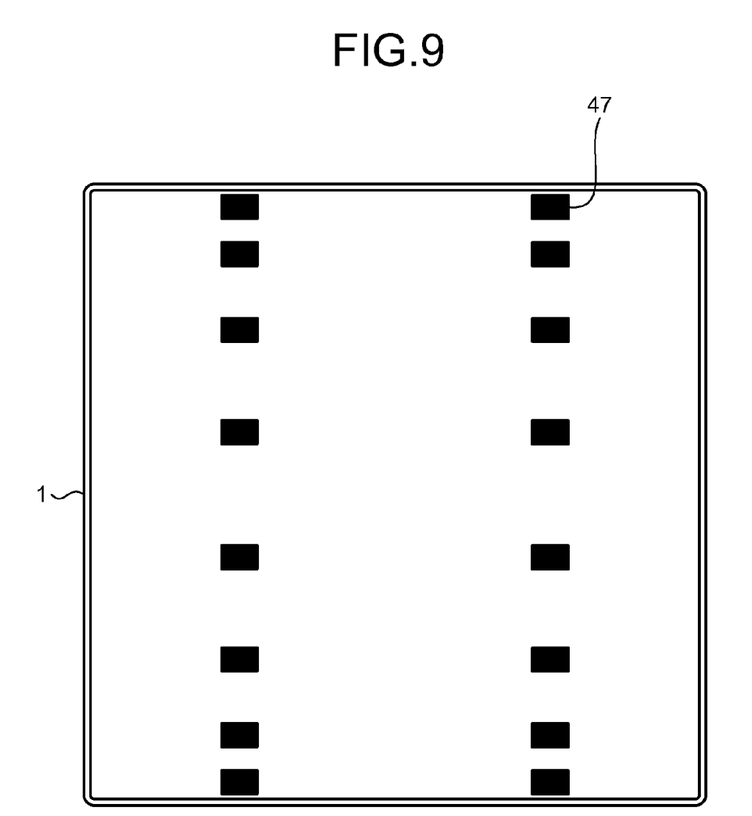
FIG. 9 depicts a solar battery cell according to a fourth embodiment of the present invention as viewed from a rear surface side.
Figure 10:
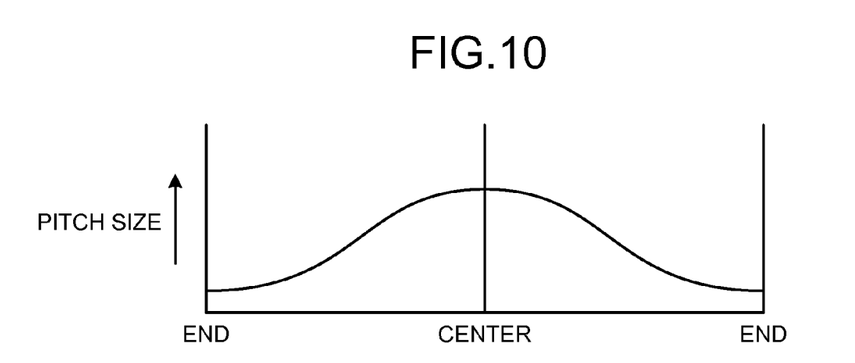
FIG. 10 is a graph of a change of pitches among silver electrodes according to the fourth embodiment of the present invention.

FIG. 9 depicts a solar battery cell according to a fourth embodiment of the present invention as viewed from a rear surface side. FIG. 10 is a graph of a change in the pitches among silver electrodes according to the present embodiment. In FIG. 10, the size of the pitch is plotted on the vertical axis, and the distance from the center to the end along a rear-surface tab line is plotted on the horizontal axis. As shown in FIGS. 9 and 10, the pitches of silver electrodes 47 according to the present embodiment are largest in the central part of the silicon substrate 1, gradually decrease toward the ends, and become smallest at the ends of the silicon substrate 1.

The warpage of the silicon substrate 1 generated due to the difference in the linear expansion coefficients of the silicon substrate 1 and the rear-surface tab line 8 is smallest in the central part and is largest at the ends. Therefore, the arrangement of the silver electrodes 47 is set in the manner described above, so that the rigidity in the central part of the silicon substrate 1 becomes relatively small and the rigidity at the ends of the silicon substrate 1 becomes relatively large, thereby enabling to suppress the warpage generated in the silicon substrate 1 efficiently.

INDUSTRIAL APPLICABILITY

As described above, the solar battery cell according to the present invention is preferably applied to a solar battery cell including a light-receiving-surface lead bonding electrodes on a light receiving surface and a rear-surface lead bonding electrodes on the rear surface, and is particularly suitable to be applied to a solar battery cell in which rear-surface lead bonding electrodes are formed in a dot shape with a predetermined gap therebetween.

REFERENCE SIGNS LIST

1 SILICON SUBSTRATE (SEMICONDUCTOR SUBSTRATE)
2 GRID ELECTRODE
3 BUS BAR ELECTRODE (LIGHT-RECEIVING-SURFACE LEAD BONDING ELECTRODE)
5 LIGHT-RECEIVING-SURFACE TAB LINE (LIGHT-RECEIVING SURFACE LEAD)
5a EXTENDED PORTION
7, 27, 37, 47 SILVER ELECTRODE (REAR-SURFACE LEAD BONDING ELECTRODE)
8 REAR-SURFACE TAB LINE (REAR SURFACE LEAD)
11 TRANSLUCENT SUBSTRATE
12 LIGHT-RECEIVING-SURFACE SEALING MATERIAL
13 SOLAR BATTERY CELL
15 REAR-SURFACE SEALING MATERIAL
16 BACK SHEET
50 SOLAR BATTERY MODULE

The invention claimed is:

1. A solar battery cell comprising:
a light-receiving-surface lead bonding electrode on a light receiving surface of a semiconductor substrate that receives sunlight to generate power; and
rear-surface lead bonding electrodes on a rear surface of the semiconductor substrate, wherein
in the solar battery cell, a light-receiving surface lead and a rear surface lead are connected to the light-receiving-surface lead bonding electrode and the rear-surface lead bonding electrode, respectively, and generated power is extracted, and wherein
the rear-surface lead extends linearly on a rear surface of the semiconductor substrate, and
a plurality of the rear-surface lead bonding electrodes being separated from each other and having same sizes are formed in a dot shape with a predetermined gap therebetween in a single line along the rear surface lead, and pitches among the rear-surface lead bonding electrodes are set so that each pitch in opposite endmost parts of the semiconductor substrate is smaller than every pitch between the opposite endmost parts of the semiconductor substrate,
wherein the pitches among the rear-surface lead bonding electrodes are largest in a central part of the semiconductor substrate, decrease towards the opposite endmost parts of the semiconductor substrate, and become smallest at the opposite endmost parts of the semiconductor substrate, and
a relation of pitches among the rear-surface lead bonding electrodes is represented as $A \geq C > B$, when a pitch in a central part of the semiconductor substrate is designated as A, a pitch in one of the opposite endmost parts of the semiconductor substrate is designated as B, and a pitch in an intermediate part between the central part and one of the opposite endmost parts of the semiconductor substrate is designated as C wherein the relation of the pitches among the rear-surface lead bonding electrodes is represented as $A=C$, and as $A:B=2:1$.

2. The solar battery cell according to claim 1, wherein the rear-surface lead bonding electrodes at the smaller pitch are provided for a plurality of consecutive pitches.

3. The solar battery cell according to claim 1, wherein a thickness of the semiconductor substrate is equal to or less than 200 micrometers.

4. The solar battery cell according to claim 3, wherein a thickness of the semiconductor substrate is equal to or less than 160 micrometers.

* * * * *